(12) United States Patent
Gärtner et al.

(10) Patent No.: US 7,844,798 B2
(45) Date of Patent: Nov. 30, 2010

(54) COMMAND PROTOCOL FOR INTEGRATED CIRCUITS

(75) Inventors: Andreas Gärtner, Munich (DE); Georg Braun, Holzkirchen (DE); Maurizio Skerlj, Munich (DE); Johannes Stecker, Munich (DE)

(73) Assignee: Qimonda AG, Munich (DE)

( * ) Notice: Subject to any disclaimer, the term of this patent is extended or adjusted under 35 U.S.C. 154(b) by 410 days.

(21) Appl. No.: 11/955,659

(22) Filed: Dec. 13, 2007

(65) Prior Publication Data

US 2009/0158010 A1 Jun. 18, 2009

(51) Int. Cl.
   *G06F 1/32* (2006.01)
(52) U.S. Cl. ........................ 712/208; 713/323
(58) Field of Classification Search ............... 712/208
   See application file for complete search history.

(56) References Cited

U.S. PATENT DOCUMENTS

| | | | | |
|---|---|---|---|---|
| 5,584,031 A | * | 12/1996 | Burch et al. | 713/323 |
| 6,178,139 B1 | * | 1/2001 | Hirobe et al. | 365/233.19 |
| 6,343,040 B2 | * | 1/2002 | Bae | 365/203 |
| 7,042,797 B2 | * | 5/2006 | You | 365/230.06 |
| 7,184,330 B2 | * | 2/2007 | Tajima et al. | 365/200 |
| 7,379,376 B2 | * | 5/2008 | Oh et al. | 365/230.06 |
| 2005/0265091 A1 | * | 12/2005 | Tajima et al. | 365/200 |
| 2006/0245292 A1 | * | 11/2006 | Lee | 365/233 |

* cited by examiner

*Primary Examiner*—Eric Coleman
(74) *Attorney, Agent, or Firm*—Edell, Shapiro & Finnan, LLC

(57) ABSTRACT

A method of operating an integrated circuit involves supplying an instruction portion of a command to the integrated circuit to specify an operation to be performed by the integrated circuit. At least some types of commands also include an attributes portion that provides additional information about the operation to be performed. The attributes portion of the command is supplied to the integrated circuit with a delay relative to the instruction portion of the command. The integrated circuit selectively enables circuitry for processing the attributes portion if the integrated circuit determines from the received instruction portion that the command also includes an attributes portion. The delay between the two portions of the command provides sufficient time for the integrated circuit to enable the attributes processing circuitry, which, in a default state, can be disabled during an active mode of the integrated circuit to save power.

25 Claims, 4 Drawing Sheets

COMMAND PROTOCOL FOR INTEGRATED CIRCUITS

BACKGROUND

In many devices which use integrated circuits, it is desirable to minimize power consumption. The more power consumed by an integrated circuit device, the greater the amount of heat generated. As integrated circuits continue to be miniaturized and circuit densities increase, reduction of power consumption becomes increasingly necessary to minimize heat dissipation and maintain acceptable operating temperatures. It is also desirable to minimize power consumption of integrated circuits in devices with a limited power supply, such as a battery, in order to maximize the operating time of such devices between charges.

For these and other reasons, many integrated circuits employ dedicated sleep modes or dedicated power-down modes in which at least some portion of the integrated circuit is temporarily shut down or operates with reduced functionality using less power. External commands are typically supplied to integrated circuit devices in order to enter and exit such dedicated reduced-power modes. However, it is also desirable to reduce power consumption in integrated circuits during active modes in which integrated circuits are expected to be fully operational. It is also known to save power by running systems at lower operating frequencies; however, this approach sacrifices significant performance.

SUMMARY

A method of operating an integrated circuit which permits power savings during an active mode of operation involves supplying commands to the integrated circuit in two portions, where one of the portions of the command is delayed relative to the other portion. An instruction portion of the command is first supplied to the integrated circuit to specify an operation to be performed by the integrated circuit. At least some types of commands also include an attributes portion that provides additional information about the operation to be performed. When present, the attributes portion of the command is supplied to the integrated circuit with a delay relative to the instruction portion of the command.

The integrated circuit includes an instruction receiver configured to receive the instruction portion of the command and an attributes receiver configured to receive the attributes portion of the command. To save power, the attributes receiver and other downstream circuitry for processing the attributes portion of a command can be disabled in a default state during an active mode of the integrated circuit. The instruction receiver can temporarily enable the attributes processing circuitry, including the attributes receiver, in response to determining from the instruction portion of the command that the command also includes an attributes portion.

Since the instruction portion of the command is received in advance of the attributes portion, the instruction portion can be used to trigger enabling of the normally-off attributes processing circuitry, and the delay between the instruction portion and the attributes portion of the command provides sufficient time to ensure the attributes processing circuitry is switched on before arrival of the attributes portion of the command.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
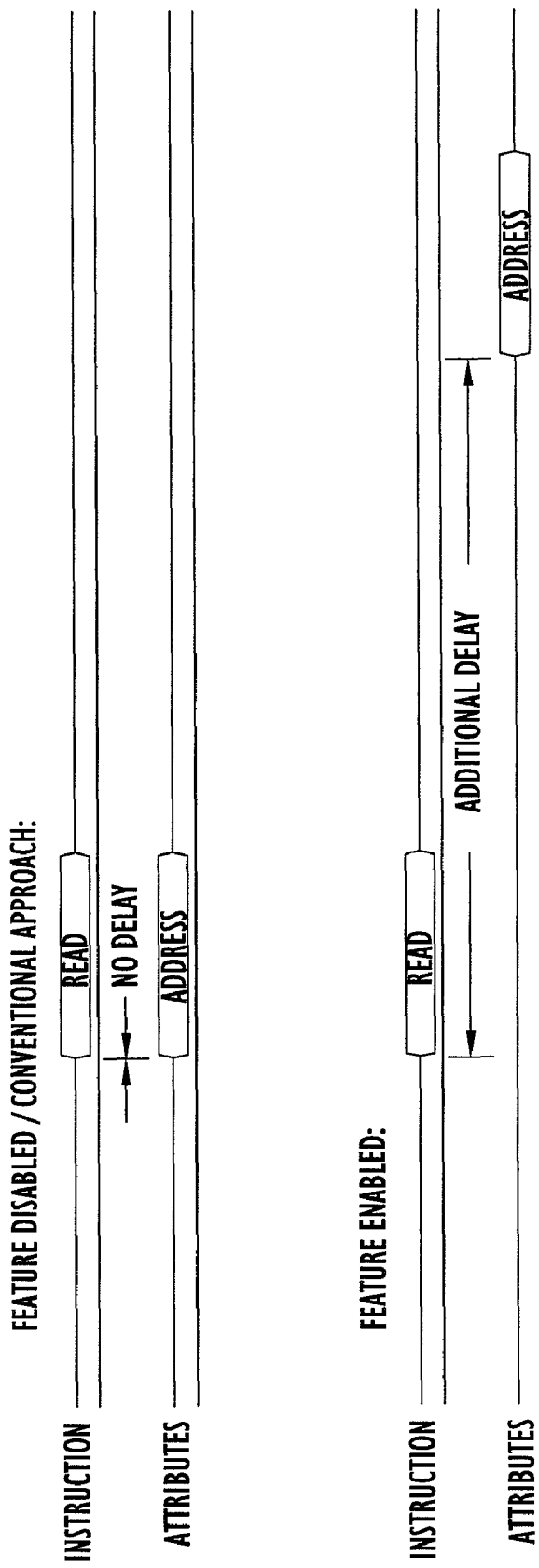
FIG. 1 is a timing diagram illustrating the timing of command instructions and attributes in accordance with an embodiment of the invention.

A command protocol for enabling power savings in an integrated circuit is described herein. In contrast to other approaches, the technique of the present invention permits powering savings in the active mode of the device, without the need to enter dedicated power-down modes with reduced functionality.

According to one embodiment, commands for operating an integrated circuit are separated into two portions. The first portion is the instruction itself, which essentially specifies the operation to be performed by the integrated circuit, and is a necessary component of all commands. The second portion of the command supplies extra attributes, which are essential for some types of instructions and provide additional information about the command to be executed, which information may be specific to the particular type of instruction involved. The attributes portion is supplied or transmitted to the integrated circuit with a certain delay relative to the instruction portion. For instructions not requiring further attributes at all, the second portion of the command may be omitted completely.

The temporal separation of the command attributes from the command instruction allows the device to activate the respective receiver circuitries on an "as-needed" basis, i.e., those circuitries are activated only in periods of actual information transfer. At other times, receiver circuits associated with the attributes of the command may be switched off partially or entirely to reduce power consumption. That is, even in an active mode of the integrated circuit, the circuitry for processing the attributes portion of the command can be shut off by default. If an instruction is registered that requires further attributes, only those parts of the circuitries that are needed for receiving and processing the attributes, or even the entire circuitry, can be enabled automatically. After the attributes have been received and processed, the respective circuitries can be shut off automatically to save power. In the case where there are no attributes to follow an instruction, the circuitries for processing the attributes need not be turned on at all and may remain off. Since a significant amount of circuitry can remain off even while the integrated circuit is in an active mode of operation, the integrated circuit consumes significantly less power and heat emission is reduced accordingly.

The attribute portion of the command is supplied to the integrated circuit at a certain period of time after the instruction portion of the command. This delay period of time allows the integrated circuit device to activate the necessary parts of the receiver circuitries for receiving the attribute portion of the command, or even the entire receiver circuitry, if necessary. The delay time between the instruction and the attributes can be variable or flexible and may depend on the individual instruction and/or on a user-programmable value. The delay feature may be disabled for backwards compatibility, for example, by setting the delay time between the instruction and attributes to zero.

Note that, other than the extra delay between the instruction and attributes, no further measures are required to activate or turn off the circuitries. In particular, it is not necessary to manually enter or exit dedicated power-down modes for the attributes processing circuitry.

FIG. 1 is a schematic timing diagram which illustrates the timing of the instruction and attributes portions of a command using the example of a read operation carried out by a memory device. It will be understood that the invention is not limited to memory devices or any particular command or set of commands and is generally applicable to virtually any type of integrated circuit or chip or portion thereof which can be controlled by commands. In this example, the instruction specifies a read operation in which bits of information stored in at a certain address within a memory array are to be retrieved and supplied to a destination external to the memory device (e.g., driven onto a bus connected to a microprocessor). The attributes in this example are the address bits which specify the location within the memory array from which the bits are to be read.

An integrated circuit typically receives a number of different instructions via a set of binary inputs, and combinations of logical ones and zeros received via the set of inputs can be decoded to determine the specific instruction. Within the set of valid instructions, some instructions may not require any additional information, while others may need to be accompanied by additional information to be carried out. For example, a memory device such a DRAM (dynamic random access memory) may be able to perform a refresh operation simply by receiving a refresh command instruction with no any additional information, whereas the DRAM requires a read instruction to be accompanied by address information. However, an integrated circuit does not typically know in advance whether a command being received is one that includes only an instruction and no related attributes (e.g., a refresh command) or one that includes both an instruction and associated attributes (e.g., a read command).

The upper part of FIG. 1 illustrates the command sequence of a read command which is executed in a conventional manner: the instruction (READ) and its related attributes (ADDRESS) are received coincidently (i.e., at the same time with no relative delay between the instruction and attributes). Since the integrated circuit does not know in advance whether the instruction requires extra attributes, all of the circuitry for receiving the attributes must be active at all times and continuously consumes power even though most of the receiver circuitry is not being used much of the time. Hence, this command scheme does not allow turning off parts of the receiver circuitry, since the memory device has to be ready for receiving an instruction and its attributes at any time.

An example of a command protocol according to the invention is illustrated in the lower part of FIG. 1. Basically, the same functional operation of the memory device is shown. However, the command is supplied as in a sequence of stages, where an additional delay between the instruction (READ) and its attributes (ADDRESS) is introduced (labeled "additional delay" in FIG. 1). During this period, the circuitries that are specifically needed for receiving and processing the attributes are activated. The decision as to which parts of the circuitry need to be activated can be determined from the specific instruction code received initially. After the additional delay has expired, the circuitry is ready for receiving the attributes.

Note that the length of the additional delay may be fixed or flexible, e.g., its duration may vary depending on the individual instruction, for example. Additionally, the delay may be user-programmable or adjustable to cover various operating frequencies. After the attributes have been received and processed, the associated circuitries can be turned off again. Likewise, a partial activation is possible if allowed by the instruction. For example, in the case of a memory device, certain instructions may require only the bank address bits and not the address bits. For instructions not requiring any extra attributes, those circuitries associated with the attributes need not to be turned on at all. Limiting the active time of the receiving circuitries to the periods of actual information transfer allows the device to minimize power consumption. To preserve backwards compatibility with existing operational protocols and devices, optionally, the integrated circuit device may include a mode in which the delay may be set to zero such that the device has the capability to operate in the conventional manner as well as with the multi-stage command protocol.

Figure 2:
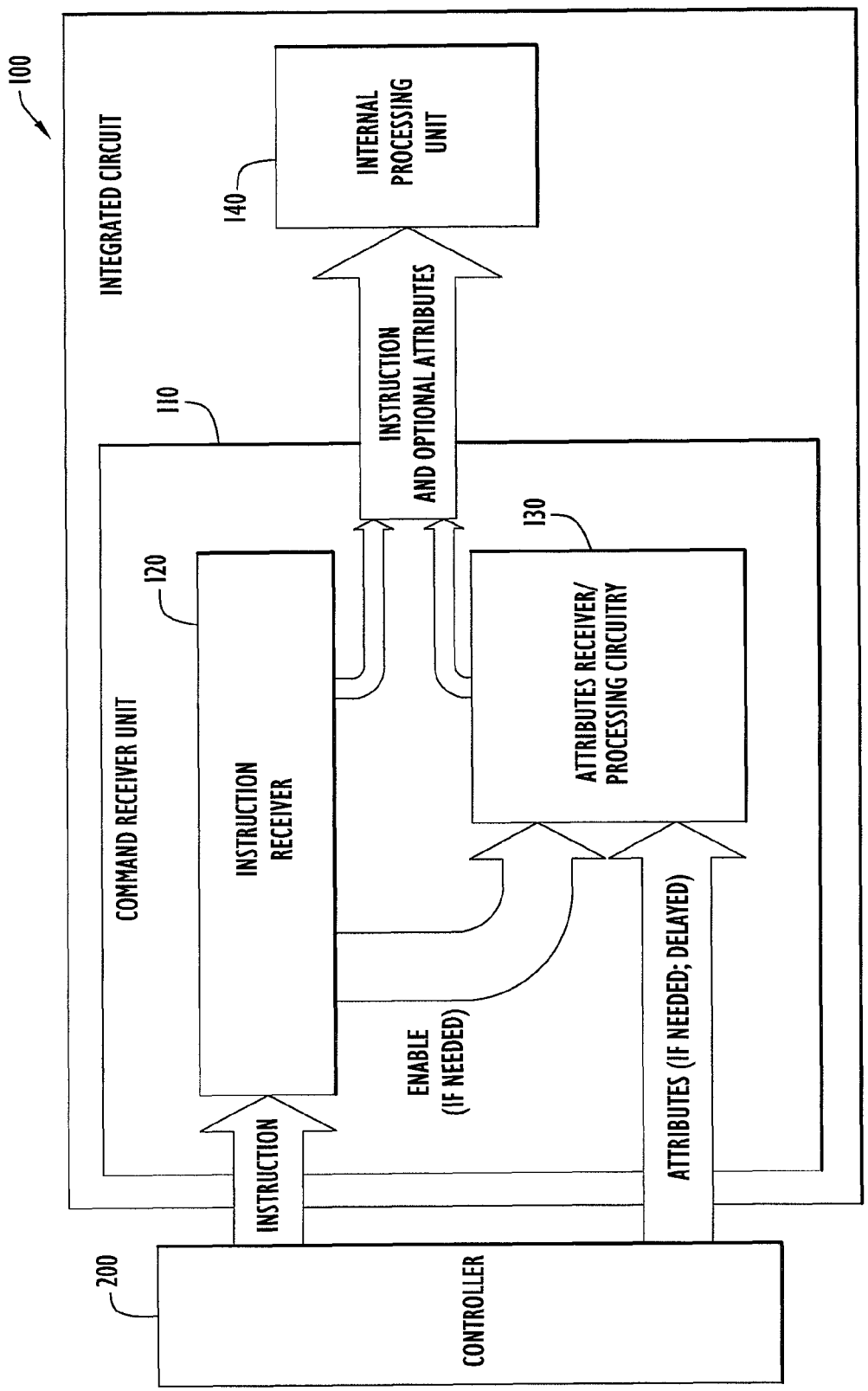
FIG. 2 is a functional block diagram of an integrated circuit for receiving commands with an instruction portion and a delayed attributes portion in accordance with an embodiment of the invention.

A possible implementation of a system which employs the multi-stage command feature is shown in the block diagram of FIG. 2. The architecture depicted in FIG. 2 is conceptual to illustrate major functional units, and does not necessarily illustrate physical relationships. An integrated circuit device 100 receives commands from a controller device 200 in two parts: an instruction portion and an attributes portion. The integrated circuit device can be any type of integrated circuit including, but not limited to: a memory device, a CPU logic device or microprocessor, a flash device or storage device, or combinations thereof. The system including the memory controller and one or more such integrated circuits can be used in a wide variety of equipment and electronic devices, including, but not limited to: computers and computer and network equipment; wireless or portable communication devices, telecommunication equipment, toys, manufacturing and industrial machinery, automotive equipment, or virtually any type of electrical or electronic equipment.

Controller 200 can include an instruction module for generating the instruction portion of the command and an attributes module for generating the attributes portion of the command. These modules of controller 200 can, for example, be configured in a conventional manner for generating commands, except that the timing between the modules is controlled such that the attributes module sends the attributes portion with a delay relative to the instruction module sending the instruction portion.

The integrated circuit 100 includes a command receiver unit 110 which receives the two portions of the command, for example, via a common bus coupling the controller 200 to the integrated circuit 100. By way of a non-limiting example, the instruction portion and the attributes portion of the command can be transmitted to the integrated circuit 100 via a command/address bus, which is typically used to send commands to a DRAM chip.

The command receiver unit includes an instruction receiver 120 and an attributes receiver 130. In addition to the receiver circuitry, the integrated circuit 100 also includes processing circuitry such as decoding logic downstream of the receiver circuitry. In the case of the attributes receiver, this additional processing circuitry is also represented generally by block 130 in FIG. 2. The command receiver unit 110 supplies decoded command information to an internal processing unit 140 for executing the operation specified by the command. The nature of the internal processing unit depends on the type of integrated circuit device. For example, in a memory device, the internal processing unit could be the memory array. In CPU logic device, the internal processing unit could be a microprocessor, and in a flash device, it could be the flash array. As suggested by FIG. 2, in the case of certain commands, the command supplied to the internal processing unit 140 includes only the instruction portion without any associated attributes. For other commands, both the instruction and associated attributes are supplied to the internal processing unit 140.

Figure 3:
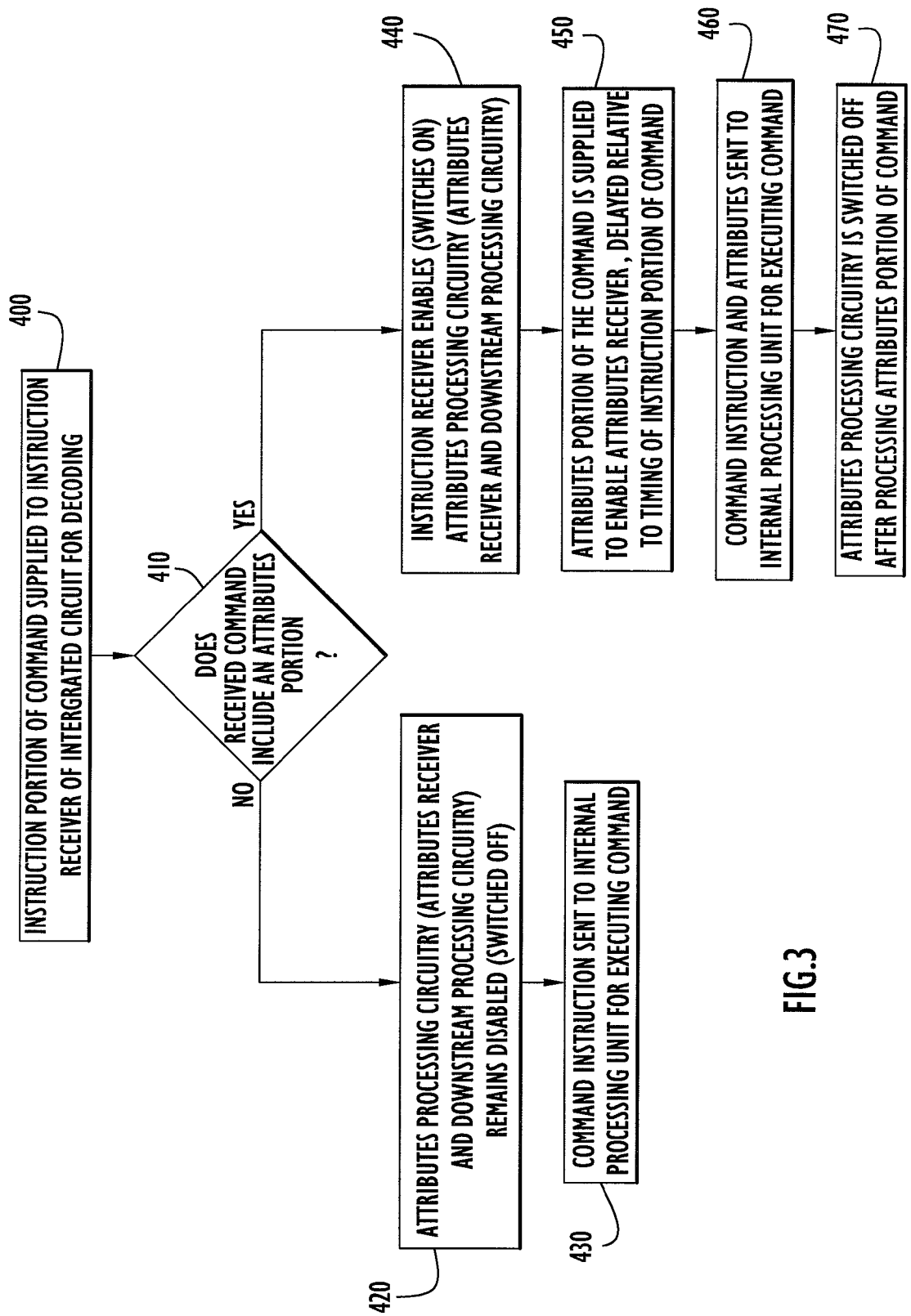
FIG. 3 is a functional flowchart illustrating a methodology of operating an integrated circuit in accordance with an embodiment of the invention.

Operation of the system shown in FIG. 2 will be described in connection with the flow diagram illustrated in FIG. 3. Initially, the instruction portion of the command is supplied by the controller 200 to the instruction receiver 120 at a first time (operation 400). The instruction receiver decodes the instruction and determines from the decoded instruction whether the command also includes an attributes portion (operation 410). In a default state, the attributes receiver and other processing circuitry remain disabled in a switched-off state. If the received instruction is that of a command which includes only an instruction and not any associated attributes, the attribute processing circuitry, including the attributes receiver, remains disabled (operation 420). In this case, the instruction (without attributes) is supplied to the internal processing unit 140 for executing the command (operation 430).

If, on the other hand, the instruction registered by the instruction receiver 120 requires any extra attributes, the attributes receiver and processing circuitry 130 is activated (operation 440). The attribute portion of the command is supplied by controller 200 to the attribute receiver at a second time that is delayed relative to the first time (operation 450). After receiving both the instruction portion and the attributes portion of the command, they are supplied to the internal processing unit 140 for executing the command (operation 460). Once the attribute receiver and downstream processing circuitry have completed processing of the attributes, they can be switched off again quickly without any further command in order to conserve power (operation 470).

Table 1 illustrates one possible implementation of a two-part command scheme in the context of commands for controlling a DRAM chip, such as a DDR3 or DDR4 generation SDRAM. The left column lists the various commands in the command set, which can be supplied on the command/address bus and can be executed by the DRAM chip. The commands are split into an instruction portion (center column) and an attributes portion (right column). The instruction portion is received via the command bus signals CS#, RAS#, CAS#, and WE#. The attributes portion of the command, if applicable, is delivered via the Bank-Address (BA) or Address (A)-Bus (or both) signals from the command/address bus.

TABLE 1

| Command | Instruction (via CS#, RAS#, CAS#, WE#) | Attributes (delayed) via . . . |
|---|---|---|
| Mode Register Set | MRS | A- and BA-Bus |
| Refresh | REF | (None) |
| Self-Refresh Entry/Exit | SRE, SRX | (None) |
| Single Bank Precharge | PRE | A[10] |
| Precharge all Banks | PREA | A[10] |
| Active | ACT | A- and BA-Bus |
| Write (BL8MRS or BC4MRS) | WR, WRS4, WRS8, WRA, WRAS4, WRAS8 | A- and BA-Bus, A[10], A[12] |

TABLE 1-continued

| Command | Instruction (via CS#, RAS#, CAS#, WE#) | Attributes (delayed) via . . . |
|---|---|---|
| Read (BL8MRS or BC4MRS) | RD, RDS4, RDS8, RDA, RDAS4, RDAS8 | A- and BA-Bus, A[10], A[12] |
| No Operation | NOP | (None) |
| Device Deselect | DES | (None) |
| Power Down Entry/Exit | PDE, PDX | (None) |
| ZQ Calibration Short/Long | ZQCS, ZQSL | A[10] |

Note, for example, that the command of certain operations, such as Refresh, Self-Refresh Entry/Exit, No Operation, Device Deselect, and Power Down Entry/Exit includes only an instruction portion and no attributes portion. Such commands can be carried out without activating any portions of the attributes receivers.

Other commands such as Mode Register Set, the pre-charging commands, and calibration commands require only a subset of the attributes receivers to be enabled (e.g., the bank address receivers or the $10^{th}$ or $12^{th}$ bit of the address receivers, which can be used as an extension of the instruction). In this case, only the receivers associated with the needed attribute bits are required to be enabled, while the other receivers can remain off.

Finally, other commands, such as the various types of Read and Write commands require all of the attribute receivers to be turned on (i.e., the receivers for all the address and bank address bits). While, in the implementation shown in Table 1, the attributes portion of the command involves only address and/or bank address bits, it will be appreciated that the invention is not necessarily limited to using only these signals for the attribute portion of the command signal.

Figure 4:
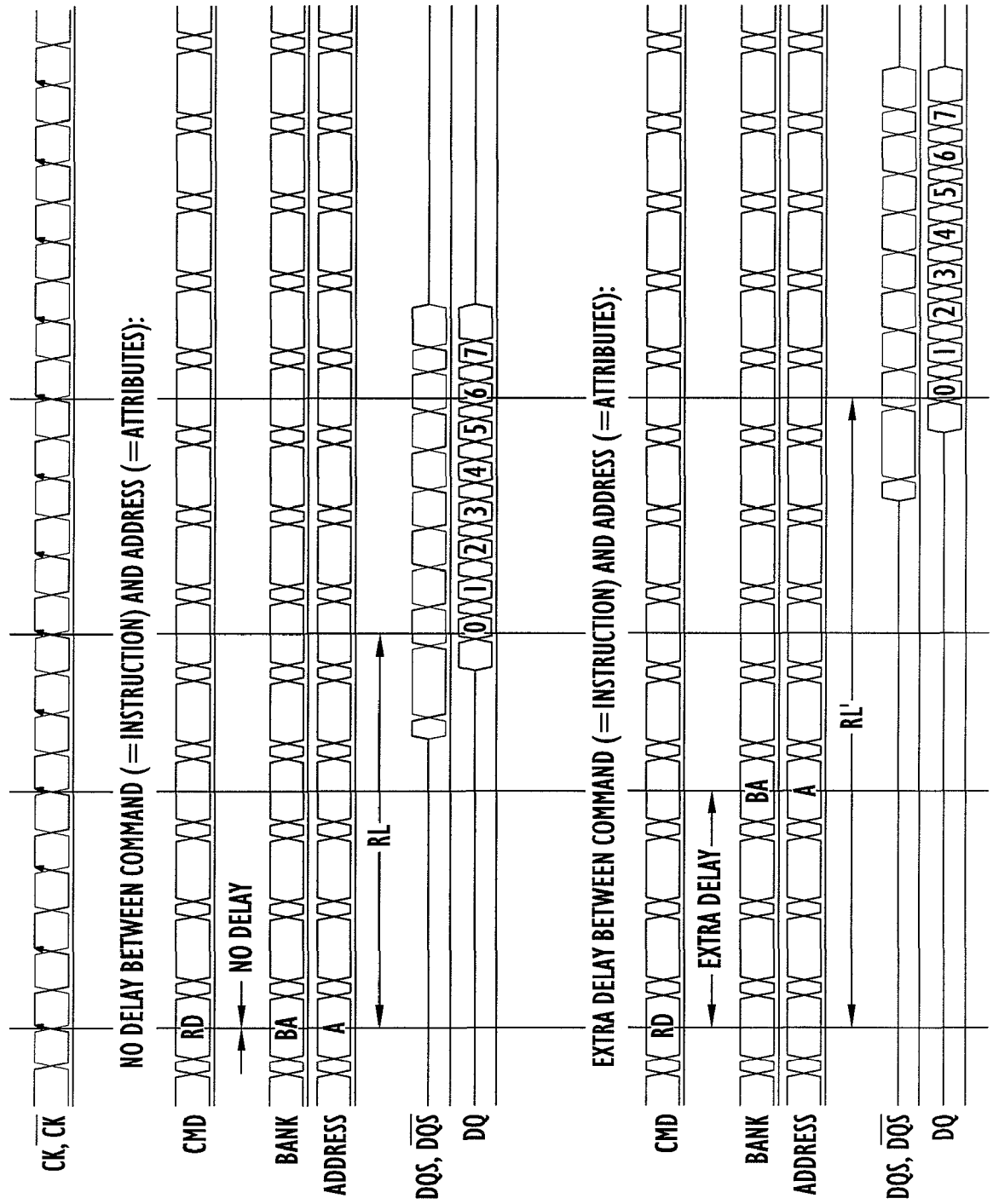
FIG. 4 is a timing diagram illustrating the timing of command instructions and attributes for a read command in a memory device according to an embodiment of the invention.

A timing diagram of a Read command for a DDR3/DDR4-based SDRAM supporting the protocol described above is shown in the FIG. 4. For comparison, the timing with no delay is also shown. The clock signals (CK and its compliment) are shown in the first line. The "CMD" signal represents the four-bit instruction portion of the command, in this case a Read (RD) instruction. The "BANK" (3 bits) and "ADDRESS" (~15 bits, depending on the memory's actual organization) signals represent the attribute portion of the Read command. The address and bank address information essentially informs the memory array which location the data is to be read from. Finally the output data strobes (DQS and its compliment) and the output data DQ are shown with a read latency (RL and RL') relative to the timing of the Read command. The "Extra Delay" between the instruction and attribute portions of the command contributes to a somewhat increased read latency RL' compared to the conventional read latency (RL) experienced with no delay. The exact duration of the Read Latency (RL, RL') and the Extra Delay are flexible. Thus, their values as shown in the FIG. 4 are merely examples to illustrate the concept. Note that the bus width delivering the instruction (e.g., 4 bits for DDR3) should be minimized in width, as the instruction receiver block has to be active permanently in order to receive a new command. However, the width of the attributes bus (e.g., 18 bits for DDR3) should be maximized as power savings will be optimized when a large number of receiver circuitry is active only when needed and is disabled when not needed. The same applies for the complexity of the receivers: if possible, as much circuitry as possible should be placed in the attributes receiver block in order to minimize the number of circuits being active permanently.

In one implementation, the integrated circuit can be configured to operate with a fixed delay between the instruction portion and the attributes portion of the command. In another implementation, the integrated circuit can be programmable to accept a range of delay periods between the instruction and attributes portion. Further, the length of the delay can be made dependent upon the particular command being executed, since the time required to enable the necessary attribute processing circuitry may be different depending on the particular instruction, number of receivers requiring activation, or the level of complexity of the circuitry involved. According to another option, the integrated circuit can be configured to have a delay which is a function of the operating frequency of the clock being supplied to the chip. The integrated circuit device can be informed of the clock rate by an external signal or by automatically sensing the frequency of the clock. The delay(s) can be programmed into the integrated circuit via an external command upon start up or permanently fixed using a one-time burn-in operation or fuse. In the case of a programmable delay, for example, the delay can be specified in analog time, and the integrated circuit can determine the number of clock cycles to which the delay corresponds, for example.

While the delay between the instruction and attributes portions of the command adds to the overall latency between the command and the availability of data on the output data bus, with current technology this delay can be roughly 1-4 nanoseconds (i.e., a duration sufficient to enable the attributes receiver), which corresponds to one or multiple clock cycles. Thus, there can be some performance penalty for introducing this delay; however, the performance penalty is very slight compared to solutions such as running the integrated circuit device with a slower clock.

According to an optional implementation, the overall delay in executing the command is increased by an amount of time less than the delay between the instruction portion and the attributes portion. This can be accomplished, for example, by forwarding the decoded instruction information to the internal processing unit before the decoded attribute information. The chip design and architecture can be optimized to take advantage of using just a portion of the command in the initial stages of executing an operation. For example, the internal processing unit can be configured to beginning initial steps in executing the specified operation while awaiting the necessary attribute information. Thus, in the flow diagram representation shown in FIG. 3, the instruction and attributes forwarded to the internal processing unit in operation 460 need not necessarily be forwarded simultaneously.

According to one option, the decoding of the command can essentially be split into two processes. A pre-decoding (e.g., of the instruction) can be initiated and the results can be forwarded to the internal processing unit. Decoding of the remaining portion of the command can then be completed when the attributes arrive; however, this decoding would not require as much time as decoding of the full command, thereby reducing the impact of the command attribute delay on the overall execution time.

In the example command set shown in Table 1, certain address bits are essentially used as an extension of the instruction for certain commands. For example the A[10] bit is essentially used as part of the instruction with a precharge command, and the A[12] bit is used as part of the instruction with a burst chop command. Thus, certain bits within the command are essentially multiplexed between the instruction and the attributes, depending on the particular command. For inputs multiplexed in this manner, the input can be configured as part of the instruction (i.e., always on) or part of the attributes (switched on only when needed). There is a tradeoff here between performance and power savings depending on whether such inputs are treated as part of the instruction or part of the attributes. Thus, the design decision may depend whether the focus is on low power or high performance in a particular situation. Further, the decision of whether such inputs are treated as part of the instruction or attributes can be made a programmable feature. According to another option, a three-stage command protocol can be adopted in which input bits of the command that are always part of the instruction are received first, input bits that are multiplexed between instructions and attributes within the command set are received after a first delay, if necessary, and input bits that are always attributes are received after a second delay, if necessary.

In general, the multi-stage (e.g., two-part) command protocol of the present invention can be employed in any scenario in which the presence or absence of one portion of a command is dependent on the state of another portion of the command, thereby permitting separation of the command into a first portion (e.g., an instruction portion) and a second portion (e.g., an attributes portion) which varies depending on the state of the first portion (e.g., the specific command). These portions of the command are supplied with an intervening time delay and may, for example, be supplied via a common bus. The command described herein is to be distinguished from related data being supplied to or retrieved from the integrated circuit (e.g., in the case of a memory device, write data is supplied to the memory device on a separate data bus and is not considered part of the command).

To provide some sense of the power savings possible with the multi-stage command protocol, a typical receiver circuit in an integrated circuit may require anywhere from 100 microamps to 1 milliamp of current, depending on the type, design, and application of the chip. Further, the decoding logic and processing circuitry downstream of each receiver may draw an equivalent amount of current. In the DDR3 DRAM example, there can be a total of 18 such attributes receivers (15 for the address bits and 3 for the bank address bits). Thus, selectively turning on these receivers and associated circuitry for only brief periods of time provides considerable power savings in the active mode. For example, in DDR3 architectures, data can be transferred in only one or two clock cycles; thus, the attribute processing circuitry can be enabled for one or just a few clock cycles to receive the attributes portion of the command. Similar power savings and reductions in heat dissipation can be achieved in other types of integrated circuit device as well. However, note that the concept of delaying the attributes portion from the instruction portion is not limited to clocked devices and may be applied to purely analog embodiments as well (i.e., in integrated circuit that operate asynchronously as well as synchronously).

Having described embodiments of a command protocol for integrated circuits, and corresponding systems, integrated circuit devices, and methodologies, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method of operating an integrated circuit, the method comprising:

supplying an instruction portion of an external command from an external controller to the integrated circuit to specify an operation to be performed by the integrated circuit; and for at least some types of instructions, supplying an attributes portion of the external command from the external controller to the integrated circuit to provide additional information about the operation to be performed, the attributes portion being supplied with a delay relative to the instruction portion, the delay providing sufficient time for the integrated circuit to enable receiver circuitry for processing the attributes portion in response to receipt of the instruction portion.

2. The method of claim 1, wherein the delay is adjustable, variable, or programmable.

3. The method of claim 1, wherein the delay is different for different types of commands.

4. The method of claim 1, wherein the instruction portion and the attributes portion of the external command are supplied on a common bus.

5. A method of operating an integrated circuit, the method comprising:

supplying an instruction portion of a command to the integrated circuit to specify an operation to be performed by the integrated circuit; and for at least some types of instructions, supplying an attributes portion of the command to the integrated circuit to provide additional information about the operation to be performed, the attributes portion being supplied with a delay relative to the instruction portion, the delay providing sufficient time for the integrated circuit to enable circuitry for processing the attributes portion in response to receipt of the instruction portion, wherein at least a portion of the command is selectively configurable between being supplied as part of the instruction portion and being supplied as part of the attributes portion.

6. The method of claim 1, wherein the external command includes an instruction for a memory device and the attributes include address bits or bank address bits.

7. A method of operating an integrated circuit, the method comprising:

receiving an instruction portion of an external command from an external controller device, the instruction portion specifying an operation to be performed by the integrated circuit;

determining from the instruction portion whether the external command also includes an attributes portion with additional information about the operation to be performed;

in response to determining that the external command includes the attributes portion, enabling receiver circuitry for processing the attributes portion; and receiving the attributes portion with the receiver circuitry with a delay relative to the instruction portion.

8. The method of claim 7, wherein the delay in adjustable, variable, or programmable, the method further comprising:

configuring the integrated circuit to account for a state of the delay.

9. The method of claim 7, further comprising:

supplying information from the instruction portion of the external command to an internal processing unit for performing the external command prior to supplying information from the attributes portion of the external command to the internal processing unit, such that a delay in executing the external command is less than the delay between the instruction portion and the attributes portion.

10. The method of claim 7, further comprising:

automatically disabling the receiver circuitry for processing attributes after a period of time sufficient to receive and process the attributes portion of the command.

11. The method of claim 7, wherein, in a default state, the receiver circuitry for processing attributes is disabled.

12. The method of claim 7, wherein the receiver circuitry for processing attributes is enabled and disabled without a dedicated power-down mode.

13. An integrated circuit for receiving external commands having an instruction portion for specifying an operation to be performed, at least some types of external commands further having an attributes portion supplied after a delay relative to the instruction portion, the attributes portion providing additional information about the operation, the integrated circuit comprising:

an instruction receiver configured to receive the instruction portion of the external command and to determine whether the external command also includes the attributes portion;

an attributes receiver configured to receive the attributes portion of the external command after the delay, wherein the instruction receiver is configured to selectively enable the attributes receiver in response to determining that the external command includes the attributes portion; and an internal processing unit configured to perform the operation according to the external command.

14. The integrated circuit of claim 13, wherein, in a default state, the attributes receiver is disabled during an active mode of the integrated circuit.

15. The integrated circuit of claim 13, wherein the attributes receiver is automatically disabled after a period of time sufficient to receive the attributes portion of the external command.

16. The integrated circuit of claim 13, wherein the attributes receiver is configured to be enabled and disabled without use of a dedicated power-down mode.

17. The integrated circuit of claim 13, wherein the instruction receiver also enables attributes processing circuitry downstream of the attributes receiver in response to receiving the instruction portion of an external command that includes an attributes portion.

18. The integrated circuit of claim 13, wherein the integrated circuit is configurable to receive the attributes portion with no delay relative to the instruction portion.

19. The integrated circuit of claim 13, wherein the delay is adjustable, variable, or programmable, and the integrated circuit is configurable to account for a state of the delay.

20. The integrated circuit of claim 13, wherein the instruction receiver supplies information from the instruction portion of the external command to the internal processing unit prior to the attributes receiver supplying information from the attributes portion of the external command to the internal processing unit, such that a delay in executing the external command is less than the delay between the instruction portion and the attributes portion.

21. The integrated circuit of claim 13, wherein the integrated circuit is configured to account for the delay between the instruction portion and the attributes portion being different for different types of external commands.

22. The integrated circuit of claim 13, wherein the integrated circuit receives the instruction portion and the attributes portion of the external command on a common bus.

23. A system for operating an integrated circuit, the system comprising:

the integrated circuit of claim 13; and a controller device configured to supply the attributes portion of the external command to the integrated circuit with the delay relative to the instruction portion, the delay providing sufficient time for the instruction receiver to enable the attributes receiver in response to receipt of the instruction portion.

24. A method of manufacturing an integrated circuit for receiving external commands from an external controller device, the commands having an instruction portion for specifying an operation to be performed, at least some types of external commands further having an attributes portion supplied after a delay relative to the instruction portion, the attributes portion providing additional information about the operation, the method comprising:

providing an instruction receiver configured to receive the instruction portion of the external command and to determine whether the external command also includes the attributes portion;

providing an attributes receiver configured to receive the attributes portion of the external command after the delay, wherein the instruction receiver is configured to selectively enable the attributes receiver in response to determining that the external command includes the attributes portion; and providing an internal processing unit configured to perform the operation according to the external command.

25. A device for generating a command for operating an integrated circuit, the device comprising:

an instruction module configured to generate an instruction portion of the command, which specifies an operation to be performed by the integrated circuit, the instruction module including circuitry configured to supply the instruction portion of the command to a bus for transmission to the integrated circuit; and an attributes module configured to generate an attributes portion of the command for at least some types of instructions, the attributes portion providing additional information about the operation to be performed, the attributes module including circuitry configured to supply the attributes portion of the command to a bus for transmission to the integrated circuit, the device being configured to supplying the attributes portion with a delay relative to the instruction portion, the delay providing sufficient time for the integrated circuit to enable receiver circuitry for receiving the attributes portion in response to receipt of the instruction portion.

* * * * *